United States Patent
Itakura et al.

(10) Patent No.: US 7,388,523 B2
(45) Date of Patent: Jun. 17, 2008

(54) MTR ENCODING METHOD, MTR DECODING METHOD, MTR ENCODER, MTR DECODER, AND MAGNETIC RECORDING DEVICE

(75) Inventors: Akihiro Itakura, Kawasaki (JP); Toshikazu Kanaoka, Kawasaki (JP); Toshio Ito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/484,933

(22) Filed: Jul. 12, 2006

(65) Prior Publication Data

US 2007/0205922 A1 Sep. 6, 2007

(30) Foreign Application Priority Data

Mar. 3, 2006 (JP) .............................. 2006-058526

(51) Int. Cl. *H03M 5/00* (2006.01)
(52) U.S. Cl. .............................. 341/58; 341/59; 341/65; 341/67
(58) Field of Classification Search .................. 341/57, 341/58, 65, 67
See application file for complete search history.

(56) References Cited

U.S. PATENT DOCUMENTS

| 6,097,321 | A * | 8/2000 | Sayiner ........................ 341/59 |
|---|---|---|---|
| 6,241,778 | B1 * | 6/2001 | de Lind van Wijngaarden et al. ............................ 341/58 |
| 6,373,407 | B1 * | 4/2002 | Nishiya et al. ............... 341/59 |
| 6,388,587 | B1 * | 5/2002 | Brickner et al. .............. 341/59 |
| 6,526,530 | B1 * | 2/2003 | Nazari et al. ................ 714/701 |
| 6,643,814 | B1 * | 11/2003 | Cideciyan et al. .......... 714/755 |
| 6,768,603 | B2 * | 7/2004 | Cideciyan et al. ............ 360/45 |
| 7,164,371 | B2 * | 1/2007 | Lee et al. ..................... 341/58 |
| 7,295,138 | B2 * | 11/2007 | Schouhamer Immink .... 341/58 |
| 7,307,556 | B2 * | 12/2007 | Lee ............................... 341/59 |
| 2001/0028318 | A1 * | 10/2001 | Hogan .......................... 341/58 |
| 2005/0225458 | A1 | 10/2005 | Ito et al. |
| 2006/0195760 | A1 * | 8/2006 | Lee et al. .................... 714/758 |

FOREIGN PATENT DOCUMENTS

JP 2005-302154 10/2005

* cited by examiner

*Primary Examiner*—Linh V Nguyen
(74) *Attorney, Agent, or Firm*—Greer, Burns & Crain, Ltd.

(57) ABSTRACT

An MTR encoder includes convolution units that perform convolution of input data using additional bits, MTR encoding units that MTR-encode data obtained by the convolution units, RDS calculating units and on-bit sequence checking units that calculate RDSs and counts the number of sequential on-bits of the data MTR-encoded by the MTR encoding units, respectively, and a selecting unit that selects optimum data based on the RDSs and the number of sequential on-bits.

13 Claims, 5 Drawing Sheets

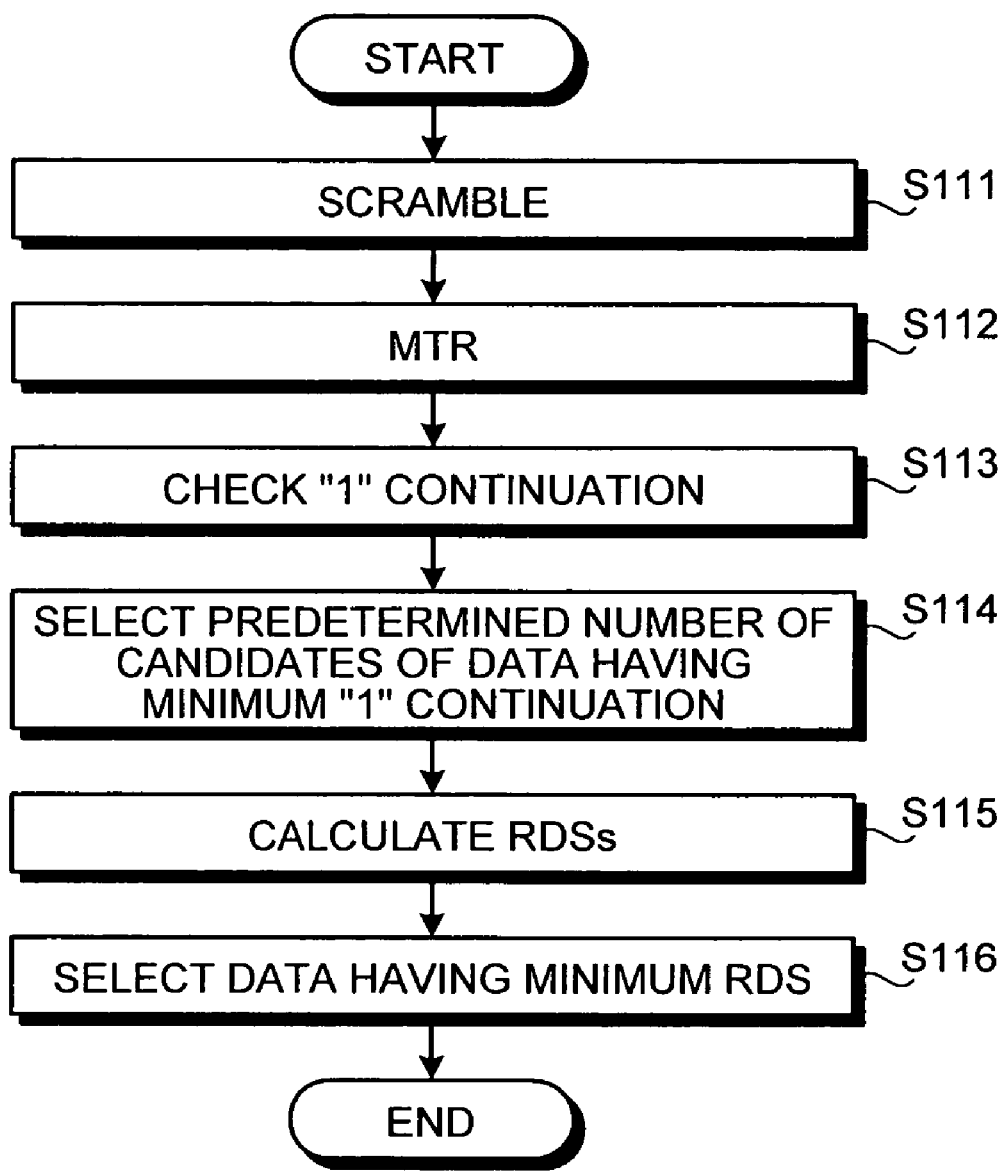

US 7,388,523 B2

MTR ENCODING METHOD, MTR DECODING METHOD, MTR ENCODER, MTR DECODER, AND MAGNETIC RECORDING DEVICE

BACKGROUND OF THE INVENTION

1. Field of the Invention

The present invention relates to an MTR encoding method, an MTR decoding method, an MTR encoder, an MTR decoder, and a magnetic recording device.

2. Description of the Related Art

Conventionally, a magnetic recording device such as a hard disk records information by magnetizing a magnetic film of a built-in magnetic recording medium by longitudinal magnetic recording. The longitudinal magnetic recording is a magnetic recording system in which a magnetization direction in the magnetic film is horizontal to the surface of the magnetic recording medium.

As disclosed in, for example, Japanese Patent Application Laid-Open No. 2005-302154, in the longitudinal magnetic recording system, information is encoded by an RLL encoder, which uses a run length limited (RLL) code, and recorded on the magnetic recording medium. Encoded information read from the magnetic recording medium is decoded by an RLL decoder.

The conventional technologies as above have the following problems. Recently, for improvement of information reproduction performance, an MTR encoder and an MTR decoder have been increasingly used instead of the RLL encoder and decoder. The MTR encoder and decoder use a maximum transition run (MTR) code to stabilize signals by limiting the number of sequential on-bits (bit 1) within a fixed number.

Besides, a recording density of the magnetic recording medium such as a hard disk has been increasing. As one of technologies contributing to the increase in recording density, a perpendicular magnetic recording system is highly promising as a recording system replacing the conventional longitudinal magnetic recording system. Whereas the magnetic film of the magnetic recording medium is magnetized in the horizontal direction in the longitudinal magnetic recording system, the magnetic film of the magnetic recording medium is magnetized in the perpendicular direction in the perpendicular magnetic recording system. This makes it possible to further stabilize the magnetization and improve the recording density.

In the perpendicular magnetic recording system, a reproduced signal has characteristics substantially different from those of a signal in the conventional longitudinal magnetic recording system. The longitudinal magnetic recording system uses a reproduced signal not containing a direct-current component, a peak of which appears at a transition point in magnetization per unit magnetization. On the other hand, the perpendicular magnetic recording system uses a signal having a direct-current component. Therefore, in the perpendicular magnetic recording system, the signal is distorted when the direct-current component is cut off due to influence of an amplifier.

Thus, in the perpendicular magnetic recording system, it is important to control the direct-current component of the signal before encoding to suppress the influence of the amplifier. When the direct-current component of the signal is controlled in advance by convolution, it is possible to suppress the influence even if the direct-current component is cut off because of the limitation of the amplifier.

However, when the signal in which the direct-current component is controlled is encoded by the MTR encoder, the control of the direct-current component is collapsed. In the perpendicular magnetic recording system, it is desirable to use the MTR code to stabilize the signal. However, it is difficult to realize both the MTR encoding and the minimization of the influence of the amplifier through the control of the direct-current component of the signal, which is indispensable for the perpendicular magnetic recording system.

Consequently, it is preferable to achieve MTR encoding of a signal to make the signal more stable by satisfying two constraints: a constraint on the number of sequential on-bits and a constraint on a direct-current component of a signal

SUMMARY OF THE INVENTION

It is an object of the present invention to at least partially solve the problems in the conventional technology.

According to an aspect of the present invention, an MTR encoding method for encoding input data with a maximum transition run (MTR) code, includes performing convolution of data in a plurality of patterns obtained by adding additional bits in a plurality of patterns to the input data to obtain a plurality of convolution data, encoding the convolution data using an MTR code to obtain a plurality of MTR-encoded convolution data, calculating a running digital sum (RDS) of the MTR-encoded convolution data, counting number of sequential on-bits of the MTR-encoded convolution data, selecting MTR-encoded convolution data with an RDS smaller than an RDS threshold and number of sequential on-bits smaller than an on-bits threshold based on calculated RDSs and counted numbers of sequential on-bits, and outputting selected MTR-encoded convolution data.

According to another aspect of the present invention, an MTR decoding method for decoding maximum transition run (MTR)-encoded data input together with additional bits, includes decoding the MTR-encoded data using an MTR code to obtain decoded data, performing inverse convolution of the decoded data using the additional bits, and outputting inverse-convoluted decoded data.

According to still another aspect of the present invention, an MTR encoder that encodes input data using a maximum transition run (MTR) code, includes a convolution unit that performs convolution of data in a plurality of patterns obtained by adding additional bits in a plurality of patterns to the input data to obtain a plurality of convolution data, an MTR encoding unit that encodes the convolution data using an MTR code to obtain a plurality of MTR-encoded convolution data, an RDS calculating unit that calculates a running digital sum (RDS) of the MTR-encoded convolution data, a sequential on-bits counting unit that counts number of sequential on-bits of the MTR-encoded convolution data, and a data selecting unit that selects MTR-encoded convolution data with an RDS smaller than an RDS threshold and number of sequential on-bits smaller than an on-bits threshold based on RDSs calculated by the RDS calculating unit and numbers of sequential on-bits counted by the sequential on-bits counting unit, and outputs selected MTR-encoded convolution data.

According to still another aspect of the present invention, an MTR decoder that decodes maximum transition run (MTR)-encoded data input together with additional bits, includes an MTR decoding unit that decodes the MTR-encoded data using an MTR code to obtain decoded data, and an inverse convolution unit that performs inverse convolution of the decoded data using the additional bits to obtain inverse-convoluted decoded data, and outputs the inverse-convoluted decoded data.

According to still another aspect of the present invention, a magnetic recording device that encodes input data using a maximum transition run (MTR) code, records encoded data on a magnetic recording medium, and decodes the encoded data read from the magnetic recording medium using the MTR code, includes an MTR encoder and an MTR decoder. The MTR encoder includes a convolution unit that performs convolution of data in a plurality of patterns obtained by adding additional bits in a plurality of patterns to the input data to obtain a plurality of convolution data, an MTR encoding unit that encodes the convolution data using an MTR code to obtain a plurality of MTR-encoded convolution data, an RDS calculating unit that calculates a running digital sum (RDS) of the MTR-encoded convolution data, a sequential on-bits counting unit that counts number of sequential on-bits of the MTR-encoded convolution data, a data selecting unit that selects MTR-encoded convolution data with an RDS smaller than an RDS threshold and number of sequential on-bits smaller than an on-bits threshold based on RDSs calculated by the RDS calculating unit and numbers of sequential on-bits counted by the sequential on-bits counting unit, and outputs selected MTR-encoded convolution data. The MTR decoder includes an MTR decoding unit that decodes the MTR-encoded data using an MTR code to obtain decoded data, and an inverse convolution unit that performs inverse convolution of the decoded data using the additional bits to obtain inverse-convoluted decoded data, and outputs the inverse-convoluted decoded data.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 7 is a flowchart of a procedure of MTR encoding performed by an MTR encoder according to another embodiment.

DETAILED DESCRIPTION OF THE PREFERRED EMBODIMENTS

Exemplary embodiments of the present invention are explained in detail below with reference to the accompanying drawings. A perpendicular magnetic recording system is used as a magnetic recording system for a magnetic recording medium in an MTR encoding method, an MTR decoding method, an MTR encoder, an MTR decoder, and a magnetic recording device according to the present invention.

Figure 1:
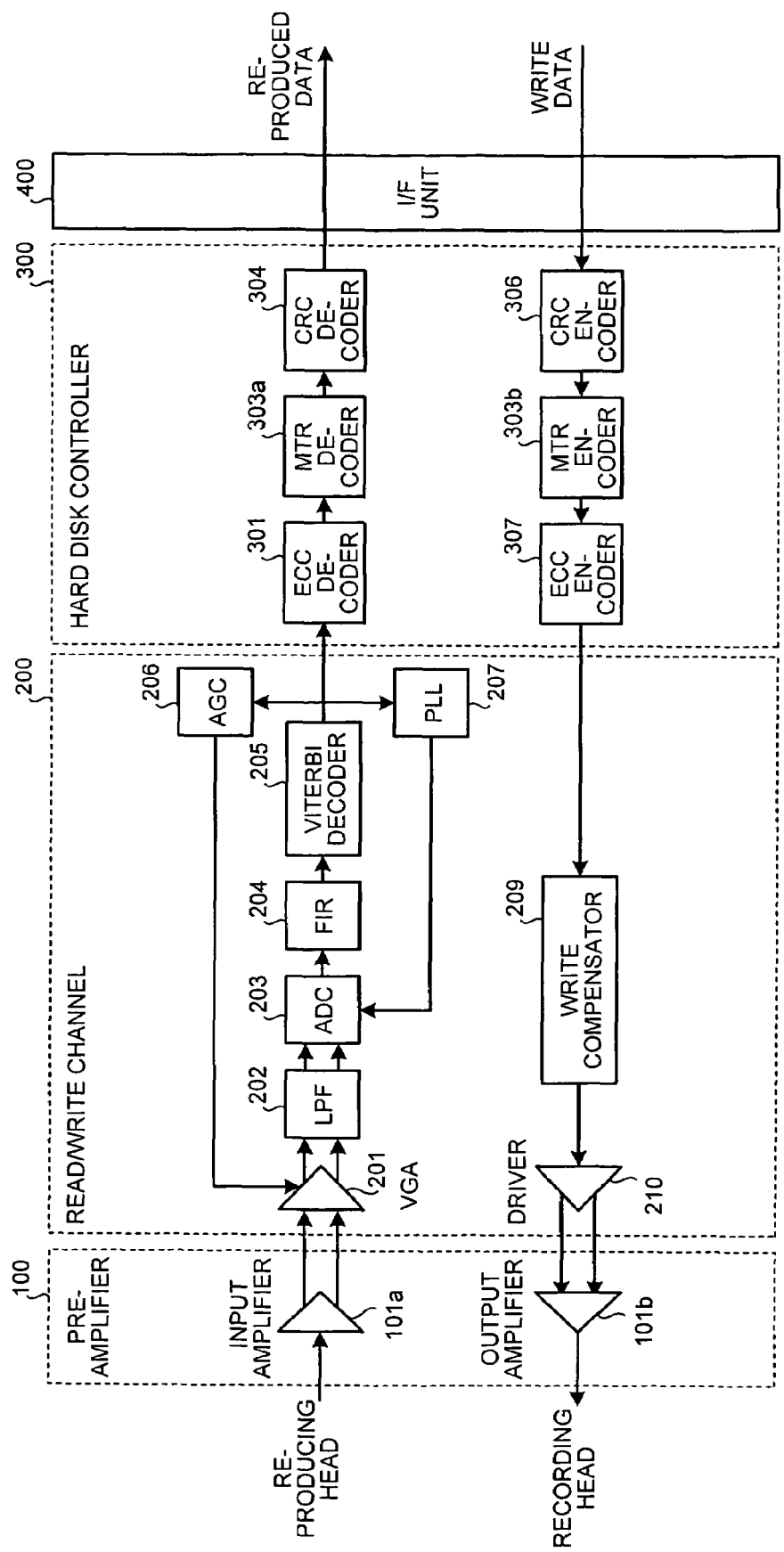
FIG. 1 is a functional block diagram of a hardware configuration of a magnetic recording device according to an embodiment of the present invention.

FIG. 1 is a functional block diagram of a hardware configuration of the magnetic recording device according to an embodiment of the present invention. FIG. 1 depicts a configuration of electric hardware related to signal processing connected between a reproducing head for reading a signal from a magnetic recording medium as well as a recording head for writing a signal to the magnetic recording medium and an output interface to the outside in the hardware configuration of the magnetic recording device. The electric hardware related to signal processing includes a preamplifier 100 that receives a signal from the reproducing head and passes the signal to the recording head, a read/write channel 200 for performing modulation and demodulation of a signal, a hard disk controller 300 that performs various kinds of encoding and decoding of a signal, and an interface (I/F) unit 400 that outputs a signal from the hard disk controller 300 to the outside and inputs a signal to the hard disk controller 300 from the outside.

The preamplifier 100 includes an input amplifier 101a for amplifying a signal input from the reproducing head and passing the signal to the read/write channel 200, and an output amplifier 101b for amplifying a signal input from the read/write channel 200 and passing the signal to the recording head.

The read/write channel 200 includes, as a reproducing circuit, a variable gain amplifier (VGA) 201 that variably adjusts a gain of a signal input, a low pass filter (LPF) 202 that allows only signals having frequencies lower than a predetermined frequency among signals received from the VGA 201 to pass and attenuates frequencies of signals equal to or higher than the predetermined frequency to frequencies lower than the predetermined frequency, an analog-to-digital converter (ADC) 203 that converts an analog signal into a digital signal; a finite impulse response filter (FIR) 204 for waveform equalization, a Viterbi decoder 205 that selects a data sequence having a minimum Euclidean distance to a reproduced signal from all data sequences assumed as a decoding result, an automatic gain controller (AGC) 206 that controls the VGA 201 such that a signal output level is constant even if an input level of a signal changes, and a phase-locked loop (PLL) 207 that controls a reference clock.

The read/write channel 200 includes, as a recording circuit, a record compensator 209 serving as a circuit that adjusts the timing of a signal received from the hard disk controller 300 by a non-linear transition shift (NLTS), i.e., temporal deviation of a magnetization reversal point, and a driver 210 for passing a high-speed serial signal having been subjected to record compensation to the recording head. The recording head records data onto the magnetic recording medium according to the serial signal received from the driver 210.

The hard disk controller 300 includes, as a reproducing circuit, an error correcting code (ECC) decoder 301 that performs error correction of a signal received from the read/write channel 200 using ECC parity, an MTR decoder 303a that decodes an MTR-encoded signal, and a cyclic redundancy check (CRC) decoder 304 that performs error detection using CRC parity. A signal decoded through the ECC decoder 301, the MTR decoder 303a, and the CRC decoder 304 is output to the outside via the I/F unit 400.

The hard disk controller 300 includes, as a recording circuit, a CRC encoder 306 that adds error detection parity to a signal input from the outside via the I/F unit 400, an MTR encoder 303b that MTR-encodes the signal, and an ECC encoder 307 that adds ECC parity to the signal MTR-encoded.

Conventional electric hardware includes an RLL decoder and an RLL encoder instead of the MTR decoder 303a and the MTR encoder 303b, respectively. However, in RLL encoding and decoding, it is impossible to control continuity of 1, that is, sequential on-bits. High-level signal voltages indicating on-bit interfere with each other to weaken each other. Thus, an error rate increases. If an MTR encoder and an MTR decoder are simply adopted instead of the RLL encoder and the RLL decoder, the error rate is reduced. However, when a controlled direct-current (DC) component is contained in a signal, this DC control is disturbed. Thus, it is difficult to adopt the MTR encoder and the MTR decoder in the perpendicular magnetic recording system that requires a DC component in a signal.

Therefore, the present invention provides an MTR encoder and an MTR decoder suitable for the perpendicular magnetic recording system that requires a DC component in a signal. According to the present invention, it is possible to set a more strict constraint concerning continuity of 1 (sequential on-bits) limited by usual MTR encoding, and reduce an error rate even in the perpendicular magnetic recording system. Thus, both constraints on continuity of 1 and DC control can be satisfied.

Figure 2:
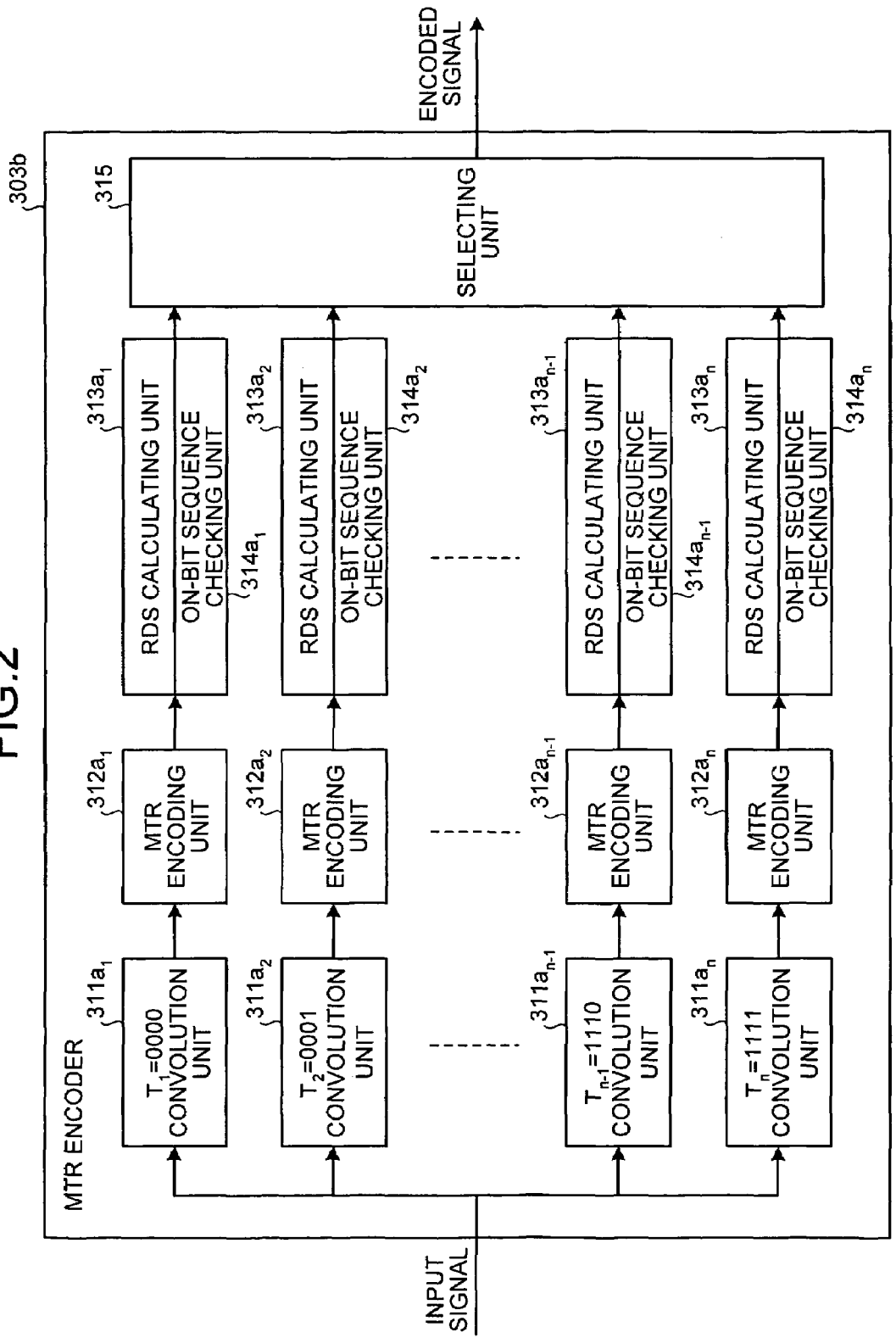
FIG. 2 is a functional block diagram of an MTR encoder shown in FIG. 1.

FIG. 2 is a functional block diagram of the structure of the MTR encoder 303b. The MTR encoder 303b includes a $T_1=0000$ convolution unit $311a_1$, a $T_2=0001$ convolution unit $311a_2$, ..., a $T_{n-1}=1110$ convolution unit $311a_{n-1}$, and a $T_n=1111$ convolution unit $311a_n$; an MTR encoding unit $312a_1$, an MTR encoding unit $312a_2$, ..., an MTR encoding unit $312a_{n-1}$, and an MTR encoding unit $312a_n$; an RDS calculating unit $313a_1$ and an on-bit (bit 1) sequence checking unit $314a_1$, an RDS calculating unit $313a_2$ and an on-bit sequence checking unit $314a_2$, ..., an RDS calculating unit $313a_{n-1}$ and an on-bit sequence checking unit $314a_{n-1}$, and an RDS calculating unit $313a_n$ and an on-bit sequence checking unit $314a_n$; and a selecting unit 315.

A running digital sum (RDS) is the sum of 1s and −1s per signal unit, where an on-bit, i.e., a bit in the on state, represents 1 and an off-bit, i.e., a bit in the off state, represents −1 in non-return to zero inverse (NRZI) format. As this value is smaller, a signal has been DC controlled more.

A signal input from the CRC encoder 306 to the MTR encoder 303b is divided into n blocks. The $T_1=0000$ convolution unit $311a_1$, the MTR encoding unit $312a_1$, the RDS calculating unit $313a_1$, and the on-bit sequence checking unit $314a_1$ are in the same system and form a path through which one system of divided signals passes. The same holds true for the $T_2=0001$ convolution unit $311a_2$, the MTR encoding unit $312a_2$, the RDS calculating unit $313a2$, and the on-bit sequence checking unit $314a_2$, ..., the $T_{n-1}=1110$ convolution unit $311a_{n-1}$, the MTR encoding unit $312a_{n-1}$, the RDS calculating unit $313a_{n-1}$, and the on-bit sequence checking unit $314a_{n-1}$.

Specifically, one of the input signals divided into n blocks is processed by the system of the $T_1=0000$ convolution unit $311a_1$, the MTR encoding unit $312a_1$, the RDS calculating unit $313a_1$, and the on-bit sequence checking unit $314a_1$. First, additional four bits $T_1=0000$ are added to input data, and the input data is subjected to convolution operation based on the additional bits. Subsequently, the convolution data is MTR-encoded by the MTR encoding unit $312a_1$. After that, an RDS and the number of sequential on-bits of the MTR-encoded data are calculated. The MTR-encoded data, the RDS, and the number of sequential on-bits are input to the selecting unit 315. Similarly, the additional bits are changed to $T_2=0001$, ..., $T_{n-1}=1110$, and $T_{n=1111}$, and data MTR-encoded are generated, respectively. RDSs and the number of sequential on-bits of the respective MTR-encoded data are calculated, and the MTR-encoded data, the RDSs, and the number of sequential on-bits are input to the selecting unit 315. The selecting unit 315, to which the data MTR-encoded based on the n different additional bits are input, selects data having the minimum RDS and the minimum number of sequential on-bits, and outputs the data. As to the selection of data, the selecting unit 315 can select data having the minimum number of sequential on-bits from a group of data with an RDS not exceeding a predetermined value, or data having the minimum RDS from a group of data with the number of sequential on-bits not exceeding a predetermined number. In both cases, it is possible to obtain DC-controlled and MTR-encoded data. The number of additional bits, four, is cited merely by way of example and without limitation. The respective MTR encoding units (the MTR encoding units $312a_1$, $312a_2$, ..., $312a_{n-1}$, and $312a_n$) can have the same structure.

In this manner, the additional bits for performing convolution are varied to apply MTR encoding to different convolution results. Thereby, it is possible to obtain MTR-encoded data more DC controlled, in which continuity of on-bits is reduced, and an error rate can be reduced. Thus, a signal can be obtained which is more suitable for the perpendicular magnetic recording system.

Figure 3:
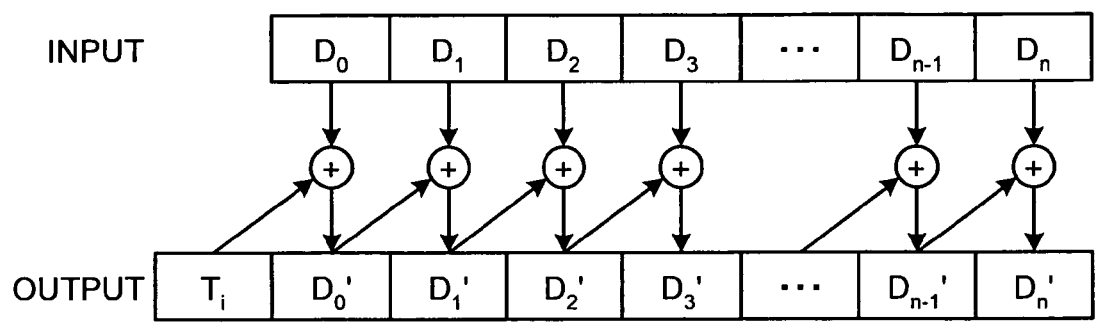
FIG. 3 is a schematic for explaining convolutional encoding performed by the MTR encoder shown in FIG. 2.

FIG. 3 is a schematic of the convolutional encoding performed by the convolution units $311a_1$ to $311an$. As shown in FIG. 3, a data sequence of an input signal INPUT is divided into segments $D_0, D_1, D_2, D_3, \ldots, D_{n-1}$, and $D_n$ in units of number of additional bits $T_i$. A convolution results of $T_i$ and $D_0$, $D_0'$ and $D_1$, $D_1'$ and $D_2$, ..., and $D_{n-1}'$ and $D_n$ are $D_0'$, $D_1'$, $D_2'$, and $D_n'$, respectively. Then, a resultant signal, in which $T_i$, $D_0'$, $D_1'$, $D_2'$, ..., $D_{n-1}'$, and $D_n'$ are arranged in this order, is output as an output signal OUTPUT.

Figure 4:
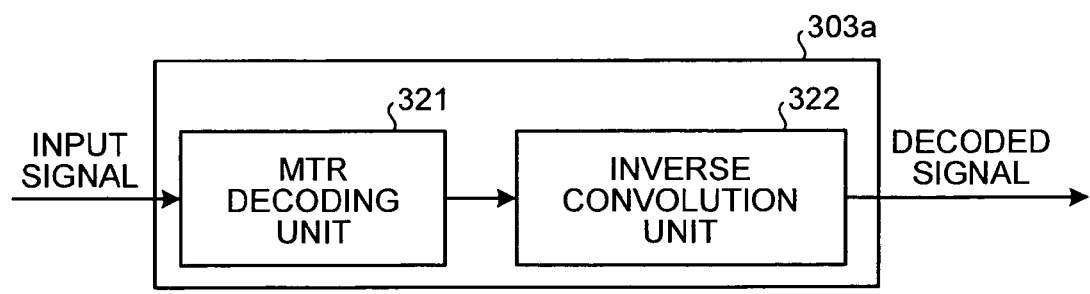
FIG. 4 is a functional block diagram of an MTR decoder shown in FIG. 1.

FIG. 4 is a functional block diagram of the MTR decoder 303a. The MTR decoder 303a includes an MTR decoding unit 321 that decodes an MTR-encoded signal input from the ECC decoder 301, and an inverse convolution unit 322 that performs inverse convolution. A signal decoded and subjected to inverse convolution is output to the CRC decoder 304.

Figure 5:
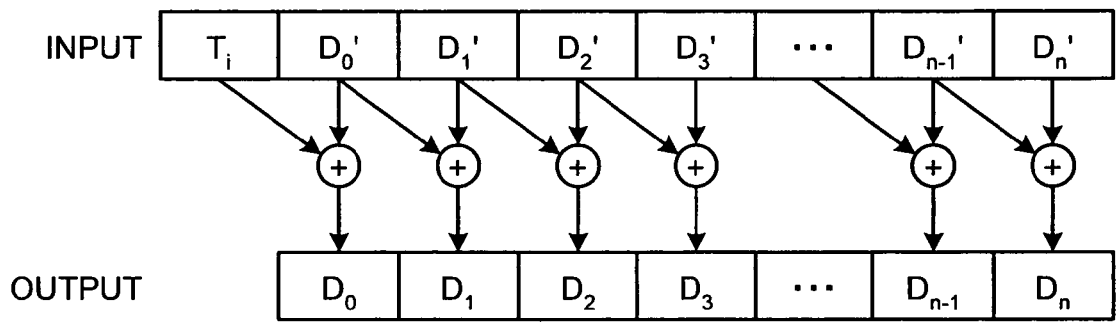
FIG. 5 is a schematic for explaining inverse convolution performed by the MTR decoder shown in FIG. 4.

FIG. 5 is a schematic of the inverse convolution performed by the inverse convolution unit 322. As shown in FIG. 5, a data sequence of an input signal INPUT is divided into segments $D_0', D_1', D_2', D_3, \ldots, D_{n-1}'$, and $D_n'$ in units of number of additional bits $T_i$. A convolution results of $T_i$ and $D_0'$, $D_0'$ and $D_1'$, $D_1'$ and $D_2'$, ..., and $D_{n-1}'$ and $D_n'$ are $D_0, D_1, D_2$, and $D_n$, respectively. Then, a resultant signal, in which $D_0, D_1, D_2, \ldots D_{n-1}$, and $D_n$ are arranged in this order, is output as an output signal OUTPUT.

Figure 6:
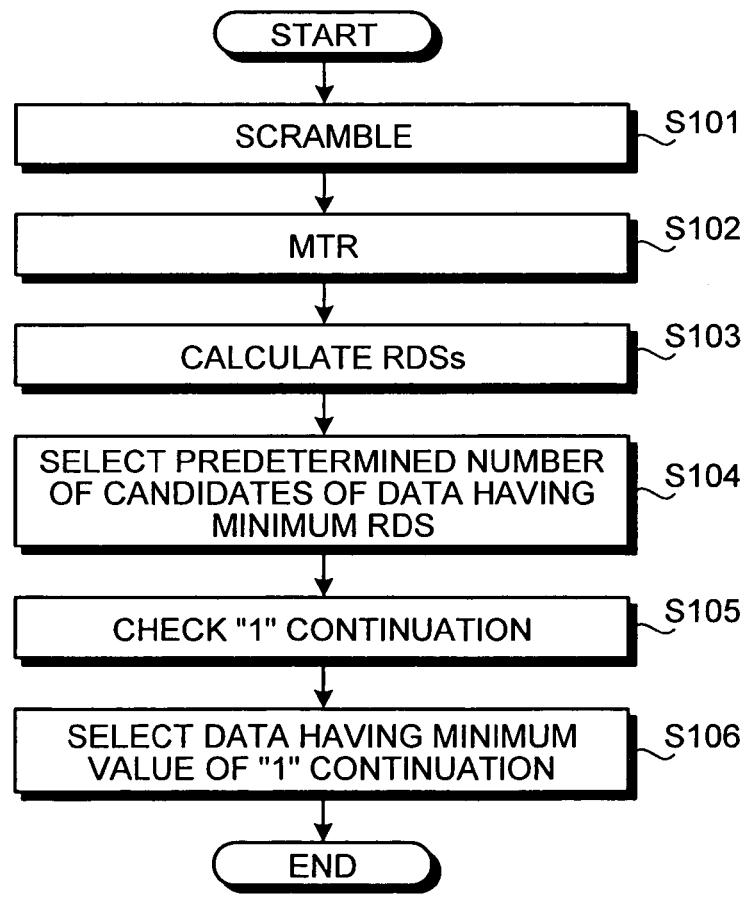
FIG. 6 is a flowchart of a procedure of MTR encoding performed by the MTR encoder shown in FIG. 2.

FIG. 6 is a flowchart of a procedure of the MTR encoding performed by the MTR encoder 303b. First, the convolution unit ($T_1=0000$ convolution unit $311a_1$, $T_2=0001$ convolution unit $311a_2$, ..., $T_{n-1}=1110$ convolution unit $311a_{n-1}$, and $T_n=1111$ convolution unit $311a_n$) performs scramble (convolution) of input data based on additional bits $T_1$, $T_2, \ldots, T_{n-1}$, and $T_n$ (step S101). Subsequently, the MTR encoding unit (MTR encoding unit $312a_1$, MTR encoding unit $312a_2$, ..., MTR encoding unit $312a_{n-1}$, and MTR encoding unit $312a_n$) MTR encodes the data (step S102). The RDS calculating unit (RDS calculating unit $313a_1$, RDS calculating unit $313a_2$, ..., RDS calculating unit $313a_{n-1}$, and RDS calculating unit $313a_n$) calculates an RDS (step S103). The MTR encoder 303b selects a predetermined number of candidate MTR-encoded data with an RDS not exceeding a predetermined value from RDSs calculated at step S103 (step S104). The MTR encoder 303b checks continuity of 1, that is, checks the on-bit sequence of each candidate data selected at step S104 (step S105). The MTR encoder 303b selects data having the minimum number of sequential 1s, that is, the minimum number of sequential on-bits from the data subjected to the on-bit sequence check at step S105 (step S106). Thereby, MTR-encoded data having a smaller RDS and the minimum number of sequential on-bits is selected. By selecting data in this manner, it is possible to obtain DC-controlled and MTR-encoded data in which continuity of 1 (sequential on-bits in a signal) is reduced.

The embodiment can be modified in various manners without departing from the scope of the invention. In addition, effects of the present invention are not limited to those described in the above embodiment.

FIG. 7 is a flowchart of a procedure of MTR encoding performed by an MTR encoder according to another embodiment. In FIG. 7, steps S111 and S112 are the same as those in FIG. 6. Steps S113 and S114 are similar to steps S105 and S106 in FIG. 6. Steps S115 and S116 are similar to steps S103 and S104 in FIG. 6. Specifically, the MTR encoder checks continuity of 1, that is, checks the on-bit sequence of each input data (step S113). The MTR encoder 303b selects a predetermined number of candidate MTR-encoded data with the number of sequential 1s, that is, the number of sequential on-bits, not exceeding a predetermined number from the data subjected to the on-bit sequence check at step S113 (step S114). The MTR encoder 303b calculates RDSs in the RDS calculating units $313a_1$ to $313a_n$ (step S115), and selects MTR-encoded data having the minimum RDS calculated at step S115 (step S116). Thereby, MTR-encoded data having the smaller number of sequential on-bits and the minimum RDS is selected. By selecting data in this manner, it is possible to obtain DC-controlled and MTR-encoded data in which continuity of 1 (sequential on-bits in a signal) is reduced.

As set forth hereinabove, according to an embodiment of the present invention, it is possible to encode input data into DC-controlled and MTR-encoded data having a small RDS in which continuity of 1 is reduced. Thus, the data can be encoded to be more suitable for the perpendicular magnetic recording system.

Moreover, together with MTR-encoded data more DC controlled, having a small RDS, in which continuity of 1 is further reduced, additional bits used for convolution of the data are output. Thereby, the additional bits are recorded on a magnetic recording medium together with the data, and can be used for MTR decoding of the data and inverse convolution.

Furthermore, data in which continuity of 1 is reduced most is selected from candidate data with an RDS equal to or lower than a predetermined value. Or data having a minimum RDS is selected from candidate data with the number of sequential 1s equal to or smaller than a predetermined number. Therefore, it is possible to efficiently select optimum MTR-encoded data.

Although the invention has been described with respect to a specific embodiment for a complete and clear disclosure, the appended claims are not to be thus limited but are to be construed as embodying-all modifications and alternative constructions that may occur to one skilled in the art that fairly fall within the basic teaching herein set forth.

What is claimed is:

1. An MTR encoding method for encoding input data with a maximum transition run (MTR) code, the MTR encoding method comprising:

performing convolution of data in a plurality of patterns obtained by adding additional bits in a plurality of patterns to the input data to obtain a plurality of convolution data;

encoding the convolution data using an MTR code to obtain a plurality of MTR-encoded convolution data;

calculating a running digital sum (RDS) of the MTR-encoded convolution data;

counting number of sequential on-bits of the MTR-encoded convolution data;

selecting MTR-encoded convolution data with an RDS smaller than an RDS threshold and number of sequential on-bits smaller than an on-bits threshold based on calculated RDSs and counted numbers of sequential on-bits; and outputting selected MTR-encoded convolution data.

2. The MTR encoding method according to claim 1, wherein the outputting includes outputting the selected MTR-encoded convolution data together with additional bits corresponding thereto.

3. The MTR encoding method according to claim 1, wherein the selecting includes first-selecting MTR-encoded convolution data with an RDS not exceeding the RDS threshold as candidates; and second-selecting MTR-encoded convolution data with minimum number of sequential on-bits from the candidates selected at the first selecting.

4. The MTR encoding method according to claim 1, wherein the selecting includes first-selecting MTR-encoded convolution data with number of sequential on-bits not exceeding the on-bits threshold as candidates; and second-selecting MTR-encoded convolution data with a minimum RDS from the candidates selected at the first selecting.

5. An MTR decoding method for decoding maximum transition run (MTR)-encoded data input together with additional bits which were used in convolution performed for controlling a direct current component of input data in MTR encoding, the MTR decoding method comprising:

decoding the MTR-encoded data using an MTR code to obtain decoded data;

performing inverse convolution of the decoded data using the additional bits; and outputting inverse-convolution decoded data.

6. An MTR encoder that encodes input data using a maximum transition run (MTR) code, the MTR encoder comprising:

a convolution unit that performs convolution of data in a plurality of patterns obtained by adding additional bits in a plurality of patterns to the input data to obtain a plurality of convolution data;

an MTR encoding unit that encodes the convolution data using an MTR code to obtain a plurality of MTR-encoded convolution data;

an RDS calculating unit that calculates a running digital sum (RDS) of the MTR-encoded convolution data;

a sequential on-bits counting unit that counts number of sequential on-bits of the MTR-encoded convolution data; and a data selecting unit that selects MTR-encoded convolution data with an RDS smaller than an RDS threshold and number of sequential on-bits smaller than an on-bits threshold based on RDSs calculated by the RDS calculating unit and numbers of sequential on-bits counted by the sequential on-bits counting unit, and outputs selected MTR-encoded convolution data.

7. The MTR encoder according to claim 6, wherein the data selecting unit outputs the selected MTR-encoded convolution data together with additional bits corresponding thereto.

8. The MTR encoder according to claim 6, wherein the data selecting unit includes
a first data selecting unit that selects MTR-encoded convolution data with an RDS not exceeding the RDS threshold as candidates; and
a second data selecting unit that selects MTR-encoded convolution data with minimum number of sequential on-bits from the candidates selected by the first data selecting unit.

9. The MTR encoder according to claim 6, wherein the data selecting unit includes
a first data selecting unit that selects MTR-encoded convolution data with number of sequential on-bits not exceeding the on-bits threshold as candidates; and
a second data selecting unit that selects MTR-encoded convolution data with a minimum RDS from the candidates selected by the first data selecting unit.

10. An MTR decoder that decodes maximum transition run (MTR)-encoded data input together with additional bits which were used in convolution performed for controlling a direct current component of input data in MTR encoding, the MTR decoder comprising:
an MTR decoding unit that decodes the MTR-encoded data using an MTR code to obtain decoded data; and
an inverse convolution unit that performs inverse convolution of the decoded data using the additional bits to obtain inverse-convolution decoded data, and outputs the inverse-convolution decoded data.

11. A magnetic recording device that encodes input data using a maximum transition run (MTR) code, records encoded data on a magnetic recording medium, decodes the encoded data read from the magnetic recording medium using the MTR code, the magnetic recording device comprising:
an MTR encoder including
a convolution unit that performs convolution of data in a plurality of patterns obtained by adding additional bits in a plurality of patterns to the input data to obtain a plurality of convolution data;
an MTR encoding unit that encodes the convolution data using an MTR code to obtain a plurality of MTR-encoded convolution data;
an RDS calculating unit that calculates a running digital sum (RDS) of the MTR-encoded convolution data;
a sequential on-bits counting unit that counts number of sequential on-bits of the MTR-encoded convolution data; and
a data selecting unit that selects MTR-encoded convolution data with an RDS smaller than an RDS threshold and number of sequential on-bits smaller than an on-bits threshold based on RDSs calculated by the RDS calculating unit and numbers of sequential on-bits counted by the sequential on-bits counting unit, and outputs selected MTR-encoded convolution data; and
an MTR decoder including
an MTR decoding unit that decodes the MTR-encoded data using an MTR code to obtain decoded data; and
an inverse convolution unit that performs inverse convolution of the decoded data using the additional bits to obtain inverse-convolution decoded data, and outputs the inverse-convolution decoded data.

12. The magnetic recording device according to claim 11, wherein the data selecting unit includes
a first data selecting unit that selects MTR-encoded convolution data with an RDS not exceeding the RDS threshold as candidates; and
a second data selecting unit that selects MTR-encoded convolution data with minimum number of sequential on-bits from the candidates selected by the first data selecting unit.

13. The magnetic recording device according to claim 11, wherein the data selecting unit includes
a first data selecting unit that selects MTR-encoded convolution data with number of sequential on-bits not exceeding the on-bits threshold as candidates; and
a second data selecting unit that selects MTR-encoded convolution data with a minimum RDS from the candidates selected by the first data selecting unit.

* * * * *